(12) United States Patent
Dando

(10) Patent No.: US 9,653,381 B2
(45) Date of Patent: May 16, 2017

(54) SEMICONDUCTOR STRUCTURES AND DIE ASSEMBLIES INCLUDING CONDUCTIVE VIAS AND THERMALLY CONDUCTIVE ELEMENTS AND METHODS OF FORMING SUCH STRUCTURES

(71) Applicant: Micron Technology, Inc., Boise, ID (US)

(72) Inventor: Ross S. Dando, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 14/307,148

(22) Filed: Jun. 17, 2014

(65) Prior Publication Data

US 2015/0364400 A1 Dec. 17, 2015

(51) Int. Cl.
*H01L 23/48* (2006.01)
*H01L 21/768* (2006.01)
*H01L 25/065* (2006.01)
*H01L 21/762* (2006.01)
*H01L 23/36* (2006.01)

(52) U.S. Cl.
CPC .......... *H01L 23/481* (2013.01); *H01L 21/762* (2013.01); *H01L 21/76898* (2013.01); *H01L 25/065* (2013.01); *H01L 23/36* (2013.01); *H01L 2224/16145* (2013.01); *H01L 2924/0002* (2013.01)

(58) Field of Classification Search
CPC ............ H01L 2225/06541; H01L 2225/06548
See application file for complete search history.

(56) References Cited

U.S. PATENT DOCUMENTS

| 7,064,446 | B2 | 6/2006 | Barnak et al. |
| 7,381,636 | B2 | 6/2008 | Wang |
| 7,863,187 | B2 | 1/2011 | Hiatt et al. |
| 7,883,917 | B2 | 2/2011 | Liu et al. |
| 7,902,674 | B2 | 3/2011 | Chang et al. |
| 2012/0153358 | A1 | 6/2012 | Shankar et al. |
| 2013/0119527 | A1 | 5/2013 | Luo et al. |
| 2013/0154112 | A1* | 6/2013 | Zhang ............... H01L 23/3178 257/774 |
| 2013/0157436 | A1* | 6/2013 | Hummler .................. 438/424 |
| 2013/0168740 | A1* | 7/2013 | Chen ........................ 257/254 |
| 2013/0187289 | A1 | 7/2013 | Cobbley et al. |

(Continued)

*Primary Examiner* — Fernando L Toledo
*Assistant Examiner* — Valerie N Newton
(74) *Attorney, Agent, or Firm* — TraskBritt

(57) ABSTRACT

A semiconductor structure comprises conductive vias extending from an active surface of a substrate to a back side of the substrate and surrounded by a dielectric material. The conductive vias are surrounded by recessed isolation structures formed within the back side of the substrate. Conductive elements extend over the conductive vias and laterally over at least portions of the isolation structures. The conductive elements are in electrical contact with the conductive vias and electrically isolated from the substrate by the isolation structures. Thermally conductive elements in contact with the substrate are laterally spaced from the conductive elements. Die assemblies comprising the semiconductor structure, methods of forming the semiconductor structure, and methods of forming the die assemblies are also disclosed.

30 Claims, 8 Drawing Sheets

(56) References Cited

U.S. PATENT DOCUMENTS

2013/0264676 A1\* 10/2013 Yang .................. H01L 23/5226
                                                                               257/508
2013/0270670 A1\* 10/2013 Yang .................. H01L 23/5384
                                                                               257/499

\* cited by examiner

SEMICONDUCTOR STRUCTURES AND DIE ASSEMBLIES INCLUDING CONDUCTIVE VIAS AND THERMALLY CONDUCTIVE ELEMENTS AND METHODS OF FORMING SUCH STRUCTURES

TECHNICAL FIELD

Embodiments disclosed herein relate to semiconductor structures and die assemblies providing enhanced thermal management and exhibiting reduced oxide-induced wafer warpage. More specifically, embodiments disclosed herein relate to semiconductor structures and die assemblies including conductive vias and thermally conductive elements having reduced wafer warpage and improved thermal management, and methods of forming such structures and die assemblies.

BACKGROUND

Increased circuit density is an ongoing goal of manufacturers of semiconductor devices. One favored configuration to increase circuit density is an assembly of vertically stacked semiconductor dice, at least some of which are interconnected electrically, the stacked die assembly being mechanically and electrically connected to higher level packaging, such as an interposer or other substrate bearing conductive traces.

One such configuration employing a plurality of stacked semiconductor dice is a Micropillar Grid Array ("MPGA") package. Such a package comprises a stack of a plurality (for example, four (4), eight (8), sixteen (16), etc.) of dynamic random access memory (DRAM) dice vertically interconnected from an uppermost die to a lowermost die, and a plurality of electrically conductive pillars extending from the underside of the lowermost memory die for connection to a logic die, such as, by way of non-limiting example, a System on a Chip (SoC) die.

A challenge associated with stacked die packages is that the heat generated by the individual dies and associated circuitry combines and increases the operating temperatures of the individual dies, the junctions therebetween, and the package as a whole. This can cause the stacked dies to reach temperatures above their maximum operating temperatures ($T_{max}$), especially as the density of the dies in the package increases.

Another challenge associated with stacked die packages is the formation of oxide-induced stresses on a back side of semiconductor dice that make up the stacked die package. Dielectric materials on the back side of the semiconductor dice that isolate conductive portions of the dice from the substrate thereof often induce stresses in the substrate.

Accordingly, one significant focus with regard to formation of such stacked die packages is effective thermal management of heat generated during operation by stacked memory dice of the die assembly, in combination with heat generated by a logic or SoC die at the base of the die assembly so that the maximum operational temperature of each die within the package does not exceed acceptable limits. Another focus is the effective management and reduction of induced stresses that cause wafer warpage (e.g., bowing) of the semiconductor structures, which inhibits the ability of transfer and process equipment to handle wafers effectively and without damage, as well as impairing yield of wafer-level processing techniques used to form stacked die assemblies.

DETAILED DESCRIPTION

The illustrations included herewith are not meant to be actual views of any particular systems or semiconductor structures, but are merely idealized representations that are employed to describe embodiments described herein. Elements and features common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing semiconductor structures or semiconductor die assemblies, and the semiconductor structures and die assemblies described below do not form a complete semiconductor device or die assembly. Only those process acts and structures necessary to understand the embodiments described herein are described in detail below. Additional acts to form a complete semiconductor device or a complete die assembly including the semiconductor structures may be performed by conventional techniques.

Figure 1:
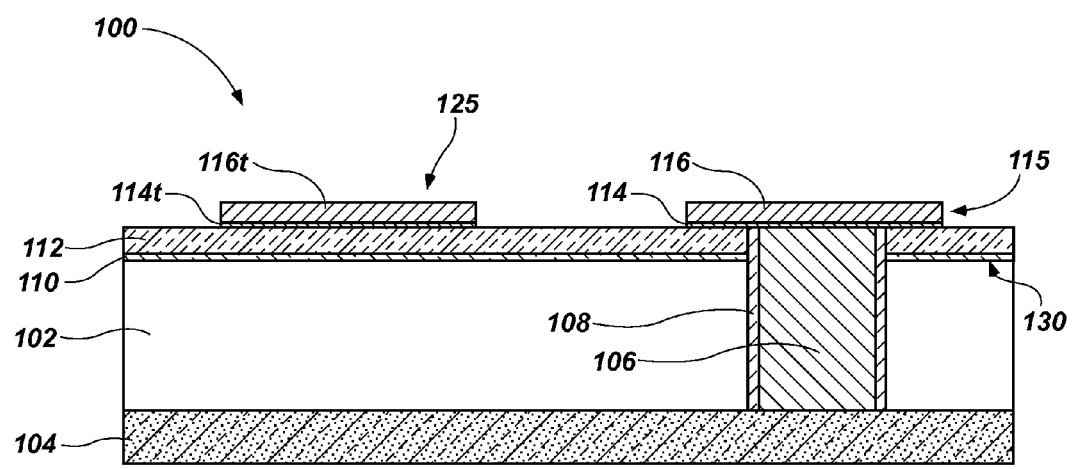
FIG. 1 is a simplified cross-sectional view showing a portion of a semiconductor structure.

A conventional semiconductor structure 100 comprising a portion of a wafer is shown in FIG. 1. The semiconductor structure 100 includes at least one conductive element in the form of a so-called "through silicon via" (TSV) 106 extending from a front side 104 (which may also be characterized as an active surface) to a back side 130 of a wafer-level substrate 102. The TSV 106 includes a conductive material that may be electrically isolated from the substrate 102 and surrounding structures by a dielectric material 108 formed around sidewalls of the TSV 106. An electrically conductive element 115 in electrical communication with the TSV 106 may include a conductive seed material 114 and a conductive material 116 formed on the conductive seed material 114. The conductive material 116 may overlie the conductive seed material 114. A barrier material 110 may overlie the back side 130 of the substrate 102. An electrically insulating material 112 may overlie the barrier material 110. The barrier material 110 and the electrically insulating material 112 may electrically insulate the electrically conductive element 115 from the substrate 102. The barrier material 110 and the electrically insulating material 112 may be continuous across the back side 130 of the substrate 102, such as between adjacent TSVs 106. However, a continuous barrier material 110 and a continuous electrically insulating material 112 extending across the back side 130 of the substrate 102 may contribute to stresses in the semiconductor material of the substrate 102, causing wafer warpage and bowing.

The semiconductor structure 100 may also include at least one thermally conductive element 125. The thermally conductive element 125 may include a conductive seed material 114t and a thermally conductive material 116t, which may also be electrically conductive, overlying the conductive seed material 114t. The thermally conductive element 125 may be employed, in combination with a thermally conductive structure, such as a pillar or stud (not shown), to transfer heat between one semiconductor structure 100 and another, adjacent, superimposed semiconductor structure 100 (not shown), in a stacked array of semiconductor structures 100. However, the barrier material 110 and the electrically insulating material 112 that isolates the conductive seed material 114t and thermally conductive material 116t of thermally conductive element 125 from the substrate 102 may impede heat transfer through the thermally conductive element 125 between adjacent semiconductor structures 100.

Figure 2:
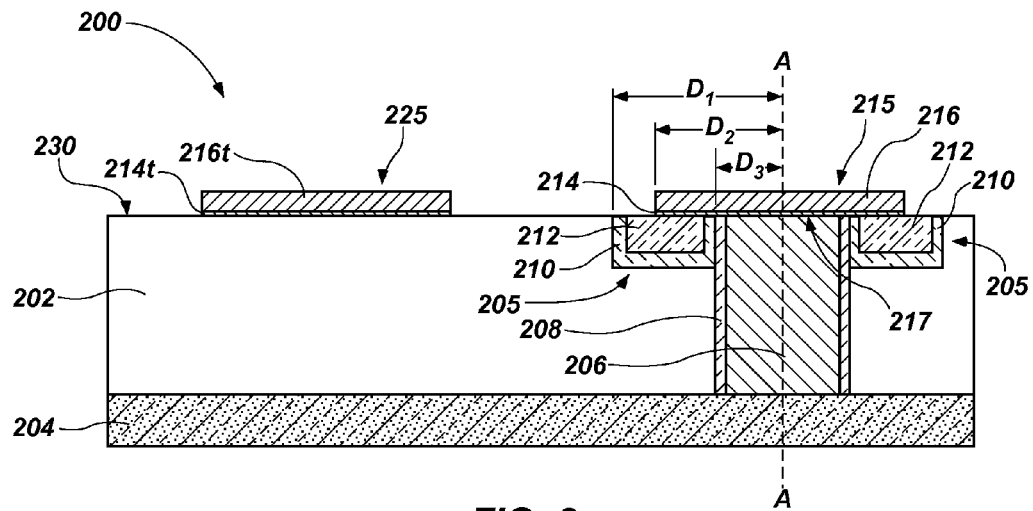
FIG. 2 is a simplified cross-sectional view showing a portion of a semiconductor structure according to embodiments of the disclosure.

A semiconductor structure 200 according to an embodiment of the disclosure and shown in FIG. 2 may exhibit reduced wafer warpage and increased thermal conductivity relative to the semiconductor structure 100 of FIG. 1.

Semiconductor structure 200 may comprise a substrate 202 in the form of a semiconductor substrate, a base semiconductor layer on a supporting structure, or a semiconductor substrate having one or more layers, structures or regions formed thereon. The substrate 202 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide.

At least one TSV 206 may electrically interconnect circuitry (e.g., active circuitry, integrated circuitry) from an active surface 204 of the semiconductor structure 200 to a back side 230 of the semiconductor structure 200. The TSV 206 may extend from the active surface 204 of the substrate 202 to the back side 230 of the substrate 202. The TSV 206 may include electrically conductive materials such as copper, aluminum, nickel, titanium, gold, tin, silver, indium, alloys thereof, or other suitable conductive material. In some embodiments, the TSV 206 includes copper. As used herein, the term "TSV" refers to an electrically and/or thermally conductive via structure that extends through any substrate 202, which substrate 202 may include any of the materials described above. Thus, the TSV 206 may extend through materials other than, or in addition to, silicon, and the term "TSV" is not limited to structures extending only through silicon.

The TSV 206 may be insulated from the substrate 202 by a dielectric material 208 that may surround sidewalls of the TSV 206. The dielectric material 208 may include, for example, one or more of silicon dioxide, silicon nitride, silicon oxynitride, phosphosilicate glass (PSG), borophosphosilicate glass (BPSG), tetraethyl orthosilicate (TEOS), polyimide, tantalum oxide ($Ta_2O_5$), aluminum oxide ($Al_2O_3$), or other dielectric materials.

An electrically conductive element 215 may be located over the back side 230 of the substrate 202 and electrically connected to active circuitry of the active surface 204. The electrically conductive element 215 may extend over, or otherwise be connected to, the TSV 206. The electrically conductive element 215 may be in electrical contact with the TSV 206 and may be electrically isolated from the substrate 202. In some embodiments, the electrically conductive element 215 is directly over the TSV 206. The electrically conductive element 215 may be configured as a discrete element in the form of, for example, a pad, which may also be characterized as a land, of a metal material or other electrically conductive material such as a conductive or conductor-filled epoxy. The electrically conductive element 215 may include an undersurface 217 that is substantially coplanar with a surface of the substrate 202. For example, undersurface 217 of the electrically conductive element 215 may be substantially coplanar with the back side 230 of the substrate 202.

The electrically conductive element 215 may extend laterally over at least a portion of an isolation structure 205. The isolation structure 205 may surround a portion of the TSV 206 and may include an electrically insulating material 212 within a recess in the substrate 202. The electrically insulating material 212 may be in contact with the electrically conductive element 215. The isolation structure 205 may also include a barrier material 210 between the electrically insulating material 212 and the substrate 202. A portion of the barrier material 210 may be located between the dielectric material 208 and the electrically insulating material 212 and at least a portion of the dielectric material 208 may be located between the TSV 206 and the electrically insulating material 212. The barrier material 210 and the electrically insulating material 212 may not extend continuously over, or even overlie a majority of the back side 230, but rather, may be a discrete structure associated with TSV 206 or a group (e.g., a plurality) of TSVs 206, and recessed within the substrate 202 adjacent to the TSV 206. In transverse cross-section, the isolation structure 205 may be shaped as a ring, an oval, a rectangle, a square, or other suitable shape extending around the TSV 206. In other embodiments, the isolation structure 205 isolates a group of TSVs 206 from each other and from other TSVs 206 or groups of TSVs 206. The isolation structure 205 may contact each TSV 206 of the group of TSVs 206 and may be continuous across the group of TSVs 206 isolated by the isolation structure 205. In transverse cross-section, the isolation structure 205 may be shaped similar to the group of TSVs 206 isolated by the isolation structure 205.

The electrically conductive element 215 may include a conductive seed material 214 and a conductive material 216 formed on the conductive seed material 214. The conductive seed material 214 is in electrical communication with the TSV 206 and with the active surface 204 of the semiconductor structure 200 through the TSV 206. The conductive seed material 214 may include a conductive material such as copper, nickel, cobalt, aluminum, titanium, palladium, silver, gold, tin, indium, and combinations thereof, such as an aluminum copper alloy or a titanium copper alloy. In some embodiments, the conductive seed material 214 includes a titanium copper alloy. The conductive seed material 214 may have a thickness between about 5 Å and about 500 Å, such as between about 5 Å and about 100 Å, between about 100 Å and about 250 Å, or between about 250 Å and about 500 Å.

The conductive material 216 may overlie the conductive seed material 214. The conductive material 216 may be formed of copper, nickel, cobalt, aluminum, titanium, palladium, silver, gold, tin, indium, and combinations thereof. The conductive material 216 may have a thickness of between about 1,000 Å (0.1 µm) and about 40 µm, such as between about 0.1 µm and 5 µm, between about 5 µm and about 10 µm, between about 10 µm and about 20 µm, or between about 20 µm and about 40 µm. In some embodiments, the conductive material 216 and the conductive seed material 214 include the same material.

A central axis A-A of the TSV 206 is shown in FIG. 2. A portion of the isolation structure 205 may extend laterally a distance of $D_1$ from axis A-A. Electrically conductive element 215 may extend laterally a distance of $D_2$ from axis A-A. Distance $D_2$ may be equal to or less than distance $D_1$ such that the isolation structure 205 laterally extends substantially the same distance as, or further, from the TSV 206 than the electrically conductive element 215. An outer portion of the dielectric material 208 may extend laterally a distance of $D_3$ from axis A-A. Distance $D_2$ may be greater than distance $D_3$. Thus, the electrically conductive element 215 extends laterally beyond the dielectric material 208 surrounding TSV 206, and at least a portion of the dielectric material 208 may be disposed laterally between the TSV 206 and the barrier material 210 and electrically insulating material 212 of the isolation structure 205 to electrically isolate the electrically conductive element 215 from the substrate 202.

The semiconductor structure 200 may also include at least one then sally conductive element 225 which may be employed, in combination with a thermally conductive structure, such as a pillar or stud (not shown) to transfer heat between one semiconductor structure 200 and an adjacent semiconductor structure 200 (not shown) to remove heat from a 3D array of structures. The thermally conductive element 225 may be used as a thermal conductor only, and may not be configured to conduct electrical signals or power. In other words, the thermally conductive element 225 may not electrically connect to integrated circuitry of the semiconductor structure 200, but may act only as a heat transfer conduit between adjacent semiconductor structures 200 in a stack of such structures. The thermally conductive element 225 may be in contact with the back side 230 of the substrate 202 and is electrically isolated from the electrically conductive element 215. The thermally conductive element 225 may be in the form of, for example, a pad or land.

The thermally conductive element 225 may include a conductive seed material 214t and a thermally conductive material 216t, which may comprise the same materials as conductive seed material 214 and conductive material 216, enabling simultaneous fabrication of thermally conductive element 225 and electrically conductive element 215. The conductive seed material 214t may be located directly on the substrate 202 and may not be thermally isolated from the substrate 202 by an intervening thermally insulative material (e.g., silicon nitride, silicon dioxide, etc.).

Electrically conductive elements 215 and thermally conductive elements 225 may, in some embodiments, be substantially homogeneously distributed across the major surface (e.g., the back side 230) of the semiconductor structure 200. However, the thermally conductive elements 225 may also be non-homogeneously distributed, with the thermally conductive elements 225 placed in regions exhibiting greater heat generation during operation (e.g., regions referred to in the industry as "hot spots"). For example, a greater number of thermally conductive elements 225 may be formed in the hot spot regions of the semiconductor structure 200 than in other regions of the semiconductor structure 200. The thermally conductive elements 225 may be of larger transverse cross-sectional surface area than the electrically conductive elements 215. Thus, although FIG. 2 depicts one thermally conductive element 225 per one electrically conductive element 215, each semiconductor structure 200 may include more or fewer thermally conductive elements 225 than electrically conductive elements 215 depending on the heat load and desired heat transfer capacity through a die assembly including the semiconductor structures 200.

A semiconductor structure comprises a conductive via extending from an active surface of a substrate to a back side of the substrate, a dielectric material on a sidewall of the conductive via, an isolation structure comprising an insulating material in a recess in the back side of the substrate and surrounding a portion of the conductive via, and a conductive material extending over and in contact with the conductive via and at least partially over the isolation structure in electrical isolation from the substrate.

A semiconductor structure comprises a substrate having active circuitry on a front side thereof, at least one conductive structure on a back side of the substrate and electrically connected to the active circuitry, an insulating material recessed within the back side of the substrate and in contact with the at least one conductive structure, and a thermally conductive element in contact with the back side of the substrate.

Figure 3A:
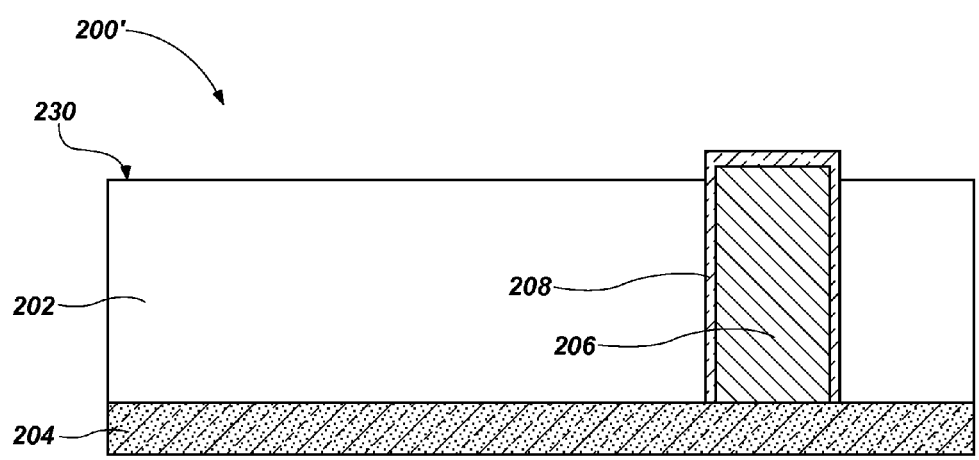
FIG. 3A through FIG. 3I are simplified cross-sectional views showing a method of forming the semiconductor structure of FIG. 2.

Referring to FIG. 3A, a method of forming a semiconductor structure 200' is shown. The semiconductor structure 200' includes a substrate 202 with completed active circuitry on an active surface 204 of the substrate 202. The semiconductor structure 200' includes at least one TSV 206 electrically connected to at least a portion of the active circuitry on the active surface 204. TSV 206 may be formed to extend from the active surface 204 of the substrate 202 to a back surface 230 of the substrate 202. The TSV 206 may be electrically isolated from the substrate 202 by a dielectric material 208. The TSV 206 and the dielectric material 208 may include any of the materials described above with reference to TSV 206 and dielectric material 208 of FIG. 2, respectively.

The active surface 204 of the semiconductor structure 200' may be attached to a support wafer or other carrier (not shown) for processing of a back side 230 thereof. The support carrier may be adhered or otherwise attached to the active surface 204 of the semiconductor structure 200'. In some embodiments, the TSV 206 may be formed partially through the substrate 202 from the active surface 204 thereof, after which the back side 230 of the semiconductor structure 200' may be thinned from, for example, an initial thickness of about 700 µm to expose a portion of the dielectric material 208 overlying TSV 206 as shown in FIG. 3A. In some embodiments the semiconductor structure 200' is thinned to a thickness of between about 20 µm and about 100 µm, such as between about 60 µm and about 80 µm, or between about 68 µm and about 72 µm. After thinning of the semiconductor structure 200', a portion of the dielectric material 208 over the TSV 206 may be exposed and extend beyond a surface of the substrate 202.

Figure 3B:
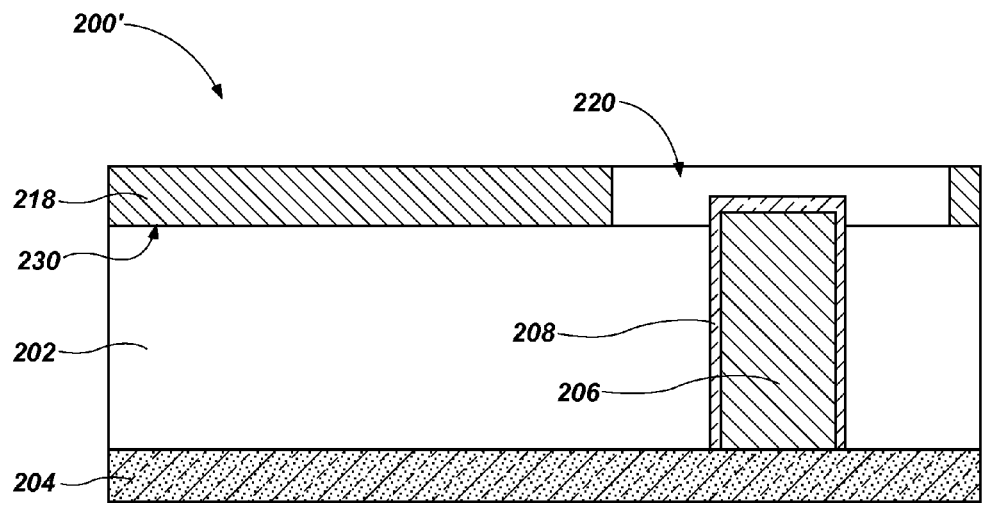

Referring to FIG. 3B, a patterning material 218 may be formed over the back side 230 of the semiconductor structure 200'. In some embodiments, the patterning material 218 is one of a positive photoresist and a negative photoresist. The patterning material 218 may be exposed to radiation (i.e., light) of an appropriate wavelength through a patterned mask and developed to form an opening 220 therein. The developer may include a solution including tetramethylammonium hydroxide (TMAH), potassium hydroxide (KOH), sodium hydroxide (NaOH), xylene, or other suitable developer. In other embodiments, the opening 220 may be formed by laser ablation. The opening 220 may be centered over the TSV 206 and may expose a portion of the substrate 202 surrounding the dielectric material 208. The opening 220 may be sized and configured for use in forming recesses in which the isolation structure 205 of FIG. 2 will be formed. In some embodiments, an opening 220 is formed around each TSV 206 and an isolation structure 205 is subsequently formed around each TSV 206, each isolation structure 205 and corresponding TSV 206 isolated from other isolation structures 205 and TSVs 206. In other embodiments, an opening 220 is formed over a group of TSVs 206 and an isolation structure 205 is subsequently formed around the group of TSVs 206.

Figure 3C:
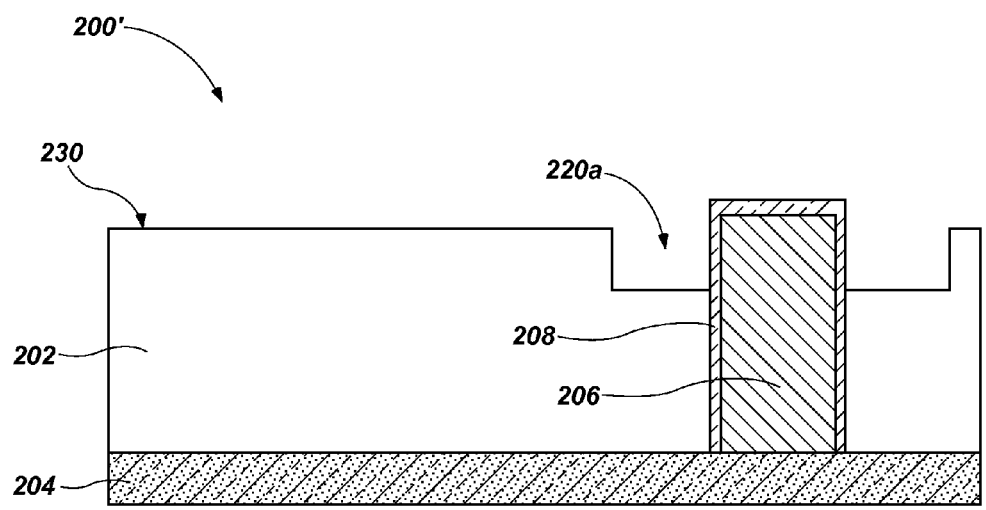

Referring to FIG. 3C, an exposed portion of the substrate 202 surrounding the dielectric material 208 may be removed to form a recess 220a in the back side 230 and around a portion of the TSV 206. The recess 220a may laterally isolate a segment of each TSV 206 from the surrounding substrate 202 and from adjacent TSVs 206. In other embodiments, the recess 220a may be formed adjacent a group of TSVs 206 to separate the group of TSVs 206 from the substrate 202 and from other TSVs 206 or groups of TSVs 206. Thus, although each recess 220a is described herein as surrounding a TSV 206, each recess 220a may surround one or more TSVs 206, or at least some of the recesses 220a may surround a group of TSVs 206 while other recesses 220a surround only a single TSV 206. The recess 220a may be of sufficient size to electrically isolate the TSV 206 and any conductive materials that will subsequently be formed over the TSV 206 from the substrate 202. For example, the recess 220a may extend from the back side 230 into the substrate 202 a depth between about 1 μm and about 10 μm, such as between about 1 μm and about 2 μm, between about 2 μm and about 4 μm, between about 4 μm and about 6 μm, or between about 6 μm and about 10 μm. The recess 220a may extend laterally beyond the dielectric material 208 on each side of the TSV 206. In transverse cross-section, the recess 220a may have a circular, oval, rectangular, square, or any other suitable shape.

The material of the substrate 202 may be anisotropically etched to form the recess 220a. The material of the substrate 202 may be removed by dry or wet etching. The etchant may be selective to the material of the substrate 202 (e.g., silicon) relative to the dielectric material 208. The etchant may remove the material of the substrate 202 but may not substantially remove the dielectric material 208. The etchant may include dry etchants such as $CF_4$, $SF_6$, $NF_3$, $Cl_2$, $CCl_2F_2$, combinations thereof, or other suitable etchants for removing the material of the substrate 202. In some embodiments, the material of the substrate 202 is removed by a dry reactive ion etch (RIE). In other embodiments, the etchant may be a wet etchant, such as a solution including nitric acid and hydrofluoric acid, potassium hydroxide, ethylenediamine pyrocatechol (EDP), TMAH, or combinations thereof.

The recess 220a may be defined by substantially straight sidewalls, oriented perpendicular to a major plane of substrate 202. An outer sidewall of recess 220a may be defined by the substrate 202 and an inner sidewall may be defined by the dielectric material 208. During the formation of recess 220a, the dielectric material 208 may remain over the TSV 206. In some embodiments, the dielectric material 208 protects the underlying conductive material of TSV 206 from reacting with or being removed by the etchants during formation of recess 220a. By way of example only, where the TSV 206 includes copper, the dielectric material 208 may prevent the formation of copper silicide over the TSV 206.

With continued reference to FIG. 3C, the patterning material 218 (FIG. 3B) may be removed after forming the recess 220a. The patterning material 218 may be removed with dry etchants, such as with a plasma including hydrogen, oxygen, nitrogen, argon, $CF_4$, $SF_6$, $CHClF_2$, or combinations thereof. In other embodiments, the patterning material 218 may be wet stripped with a stripping agent including an alkaline solution (KOH, NaOH, etc.), dimethyl sulfoxide (DMSO), sulfuric acid ($H_2SO_4$), and an oxidant such as ammonium persulfate (($NH_4)_2S_2O_8$).

Figure 3D:
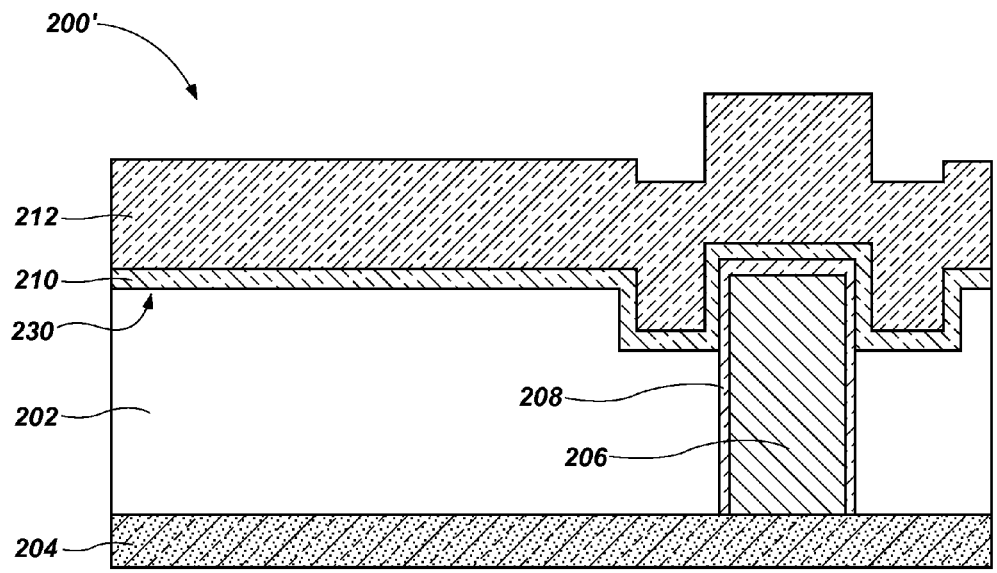

Referring to FIG. 3D, a barrier material 210 may, optionally, be formed within the recess 220a and over the back side 230. The barrier material 210 may include a nitride, such as silicon nitride. The barrier material 210 may be formed by one of atomic layer deposition (ALD), chemical vapor deposition (CVD), plasma-enhanced chemical vapor deposition (PECVD), low pressure chemical vapor deposition (LPCVD), physical vapor deposition (PVD), or other suitable deposition method. In some embodiments, the deposition may be a low temperature deposition process, such as a low temperature CVD carried out at temperatures between about 150° C. and about 200° C. The barrier material 210 may be formed such that the barrier material 210 exhibits good step coverage (e.g., is conformally formed) in recess 220a and across the TSV 206 and the back side 230. The barrier material 210 may be a diffusion barrier and substantially prevent diffusion of a conductive material (e.g., a material of electrically conductive element 215 (FIG. 2)) into the substrate 202.

A substantial portion of recess 220a may remain open after forming the barrier material 210. The barrier material 210 may have a thickness such that the barrier material 210 does not completely fill recess 220a (FIG. 3C), leaving an opening within the recess 220a. The barrier material 210 may be formed to a thickness between about 100 Å and about 20,000 Å (2 μm), such as between about 100 Å and about 1,000 Å, between about 1,000 Å and about 5,000 Å, or between about 5,000 Å and about 20,000 Å. In some embodiments, the barrier material 210 is formed to a thickness of about 1,000 Å.

An electrically insulating material 212 may be formed over the barrier material 210 and over the back side 230. The electrically insulating material 212 may include silicon dioxide, silicon nitride, a silicon oxynitride, tetraethyl orthosilicate (TEOS), a spin-on dielectric material, or other suitable electrically insulative material. The electrically insulating material 212 may fill the remainder of the recess 220a (FIG. 3C) not filled by the barrier material 210. In some embodiments, up to about 40,000 Å (4 μm) of the electrically insulating material 212 is fanned over the barrier material 210. The electrically insulating material 212 may be formed by similar methods as the barrier material 210. For example, the electrically insulating material 212 may be formed by one of ALD, CVD, PECVD, LPCVD, PVD, or other suitable deposition method. In some embodiments, the electrically insulating material 212 may be formed by a low temperature CVD process. The electrically insulating material 212 may exhibit good step coverage over the barrier material 210. The electrically insulating material 212 may be formed to a thickness greater than a thickness of the barrier material 210.

Figure 3E:
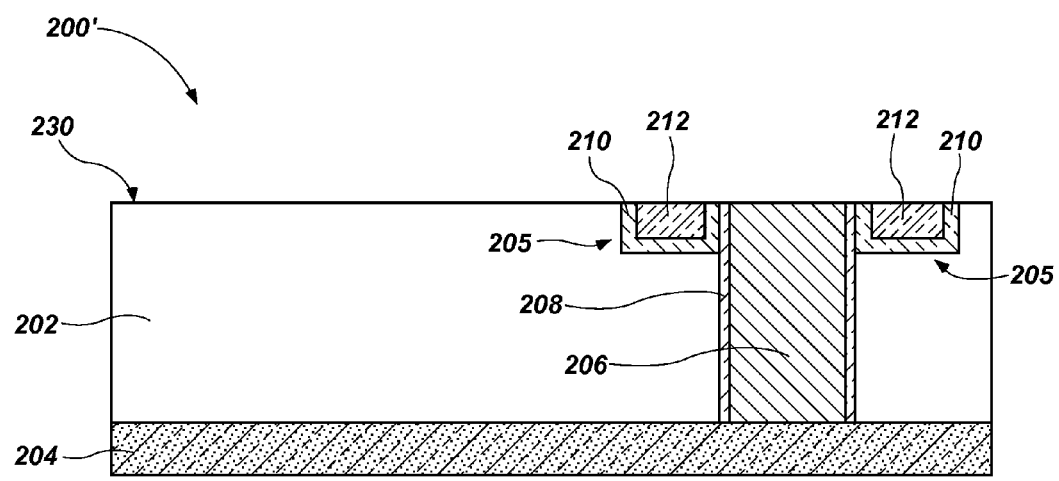

Referring to FIG. 3E, an isolation structure 205 may be formed by removing the electrically insulating material 212 and the barrier material 210 from the back side 230. A portion of the back side 230 may be exposed, while leaving the electrically insulating material 212 and the barrier material 210 within the recess 220a (FIG. 3C). In some embodiments, the electrically insulating material 212 and the barrier material 210 are removed from the back side 230 by chemical-mechanical planarization (CMP). The same CMP process may be used to simultaneously remove a portion of the dielectric material 208 over the TSV 206 and expose a conductive portion of the TSV 206. After removing the electrically insulating material 212 and the barrier material 210 from the back side 230, the electrically insulating material 212 and the barrier material 210 may remain within the recess 220a (FIG. 3C) to form the isolation structure 205. After the CMP process, the isolation structure 205 may have exposed surfaces that are coplanar with the back side 230 of the substrate 202.

Figure 3F:
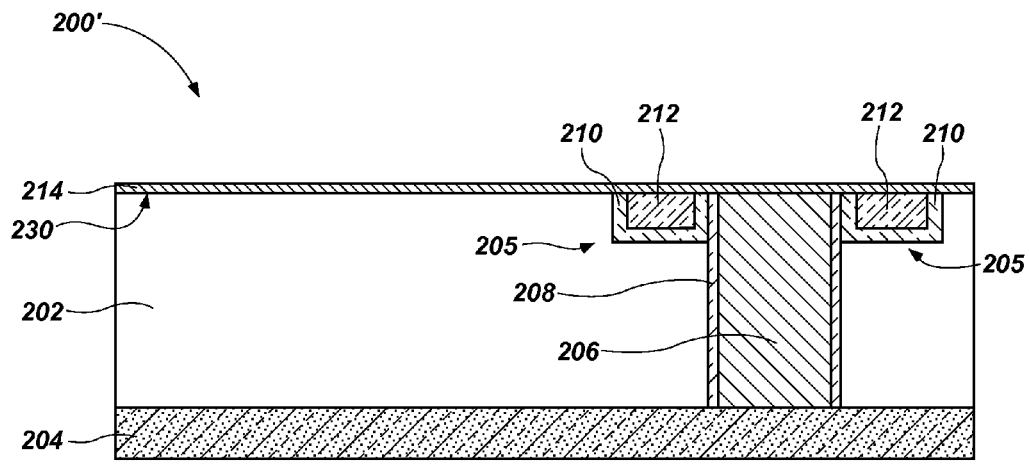

Referring to FIG. 3F, a conductive seed material 214 may be formed over the back side 230, exposed portions of the barrier material 210, the electrically insulating material 212, the dielectric material 208, and the TSV 206. The conductive seed material 214 may have a thickness of between 5 Å and about 500 Å. The conductive seed material 214 may be formed by ALD, CVD, PECVD, LPCVD, PVD, or other suitable deposition method. In some embodiments, the conductive seed material 214 is formed by PVD. The conductive seed material 214 may include copper, nickel, cobalt, aluminum, titanium, palladium, silver, gold, tin, indium, and combinations thereof. In some embodiments, the conductive seed material 214 includes an alloy of copper and titanium.

Figure 3G:
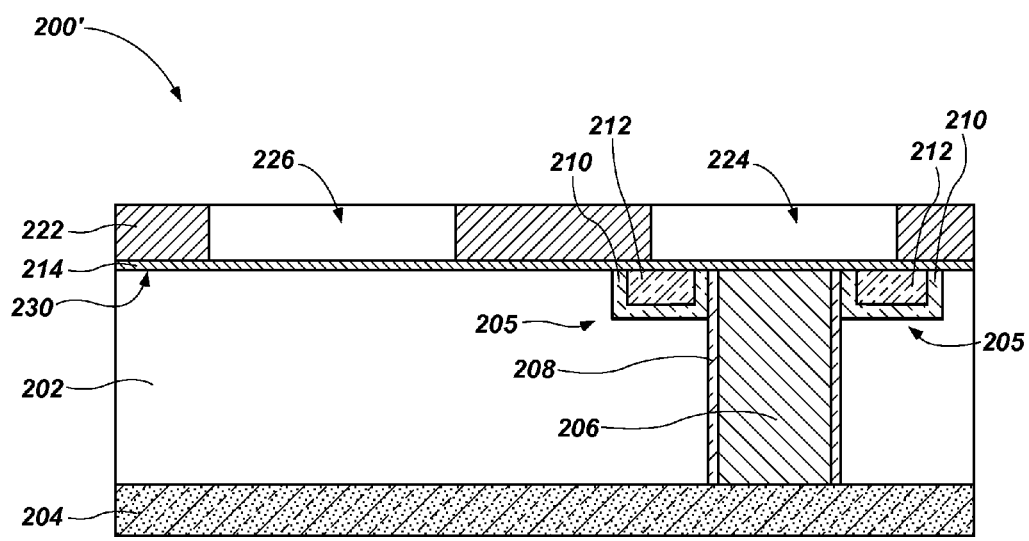

Referring to FIG. 3G, a patterning material 222 may be formed over the conductive seed material 214. The patterning material 222 may include the same materials as the patterning material 218 (FIG. 3B). Openings 224, 226 may be formed through the patterning material 222. The openings 224, 226 may be formed by similar photolithographic methods as described above with reference to opening 220 formed in patterning material 218 in FIG. 3B.

Opening 224 may be formed over a portion of the conductive seed material 214 over the TSV 206 and may extend laterally from TSV 206 over at least a portion of the electrically insulating material 212 of the isolation structure 205. Opening 226 may be formed over the conductive seed material 214 at a location laterally removed from the TSV 206. Opening 226 may expose a portion of the conductive seed material 214 located over the substrate 202.

Figure 3H:
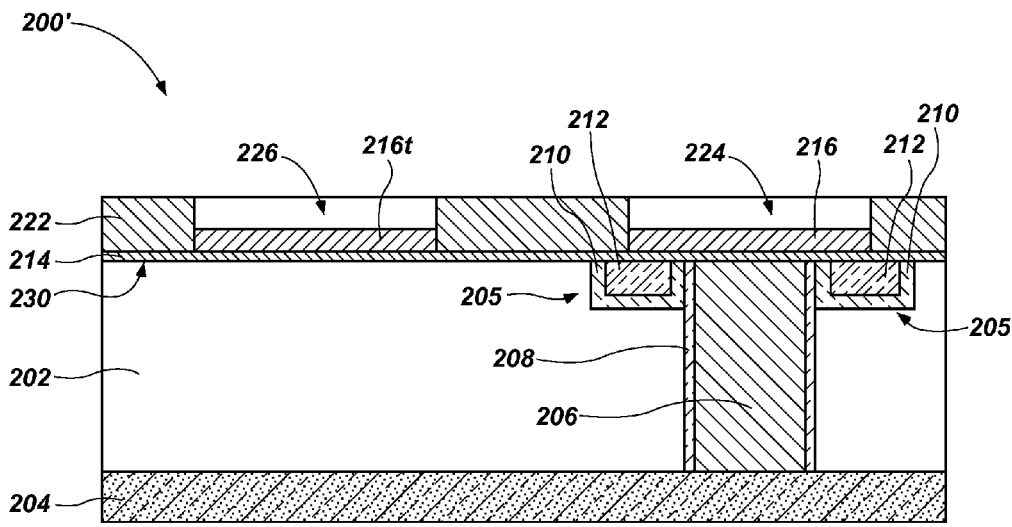

Referring to FIG. 3H, a conductive material 216 and a thermally conductive material 216t may be formed through openings 224, 226 and over conductive seed material 214 in the form of so-called "under bump metallization" pads. Conductive material 216 and thermally conductive material 216t, which may comprise the same conductive material, may be formed by electroplating, CVD, PVD, or other suitable method. In some embodiments, the conductive material 216 and the thermally conductive material 216t are formed by electroplating. The conductive material 216 and the thermally conductive material 216t may include copper, nickel, cobalt, aluminum, titanium, palladium, silver, gold, tin, indium, and combinations thereof. In some embodiments, the conductive material 216 and the thermally conductive material 216t include the same material as the conductive seed material 214. The conductive material 216 and the thermally conductive material 216t may each have a thickness of between about 5 μm and about 40 μm, such as between about 5 μm and about 10 μm, between about 10 μm and about 20 μm, or between about 20 μm and about 40 μm.

Figure 3I:
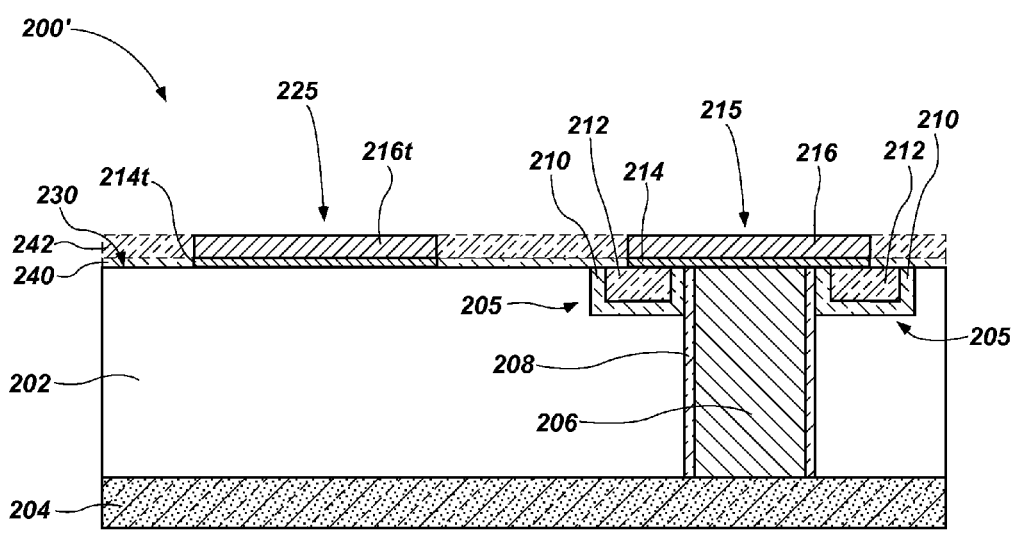

Referring to FIG. 3I, the patterning material 222 (FIG. 3H) may be removed from the back side 230, the electrically insulating material 212, the barrier material 210, and the TSV 206. The patterning material 222 may be removed by similar methods as described above with reference to the removal of patterning material 218 in FIG. 3C.

The semiconductor structure 200' may include one or more TSVs 206 with an electrically conductive structure 215 formed from the conductive seed material 214 and the conductive material 216. The electrically conductive structure 215 may be electrically connected to active circuitry of the active surface 204 of the semiconductor structure 200' via the TSV 206. However, the electrically conductive structure 215 may remain electrically isolated from the substrate 202 by the dielectric material 208 and the isolation structure 205. Although there is not a continuous electrically insulative material across the back side 230 of the substrate 202, the electrically conductive structure 215 may be electrically isolated from the substrate 202 due to the presence of the isolation structure 205.

As noted above, semiconductor structure 200' may also include a thermally conductive element 225 including a conductive seed material 214t and the thermally conductive material 216t. Thermally conductive element 225 may be structured the same as, or differently than, the electrically conductive element 215. The thermally conductive element 225 may be electrically isolated from the TSV 206 and may be in contact with the substrate 202. Thus, thermally conductive element 225 may be in thermal communication with the substrate 202 without an electrically intervening insulative material which would otherwise impede heat transfer between the thermally conductive element 225 and the substrate 202.

In some embodiments, it may be desirable to form an isolation material over exposed portions of the back side 230 of the substrate 202 between and around the thermally conductive element 225 and the electrically conductive element 215. In some embodiments, a passivation material 240 (shown in broken lines) may be formed over the back side 230 and an isolation material 242 (shown in broken lines) may be formed over the passivation material 240. The passivation material 240 may include the same or similar materials as barrier material 210. The isolation material 242 may include the same or similar materials as electrically insulating material 212. The passivation material 240 and the isolation material 242 may be formed by one of ALD, CVD, PECVD, LPCVD, PVD, or other suitable deposition method. The passivation material 240 and the isolation material 242 may be removed from surfaces of the electrically conductive element 215 and the thermally conductive element 225 to expose portions of each of the electrically conductive element 215 and the thermally conductive element 225.

A method of forming a semiconductor structure comprises forming at least one conductive via extending from an active surface of a substrate to a back surface of the substrate, forming a recess within the back surface of the substrate adjacent the at least one conductive via, forming an insulating material over the back surface and within the recess, removing the insulating material from the back surface while leaving the insulating material within the recess, and forming a conductive element over and in contact with the at least one conductive via and the insulating material.

Figure 4A:
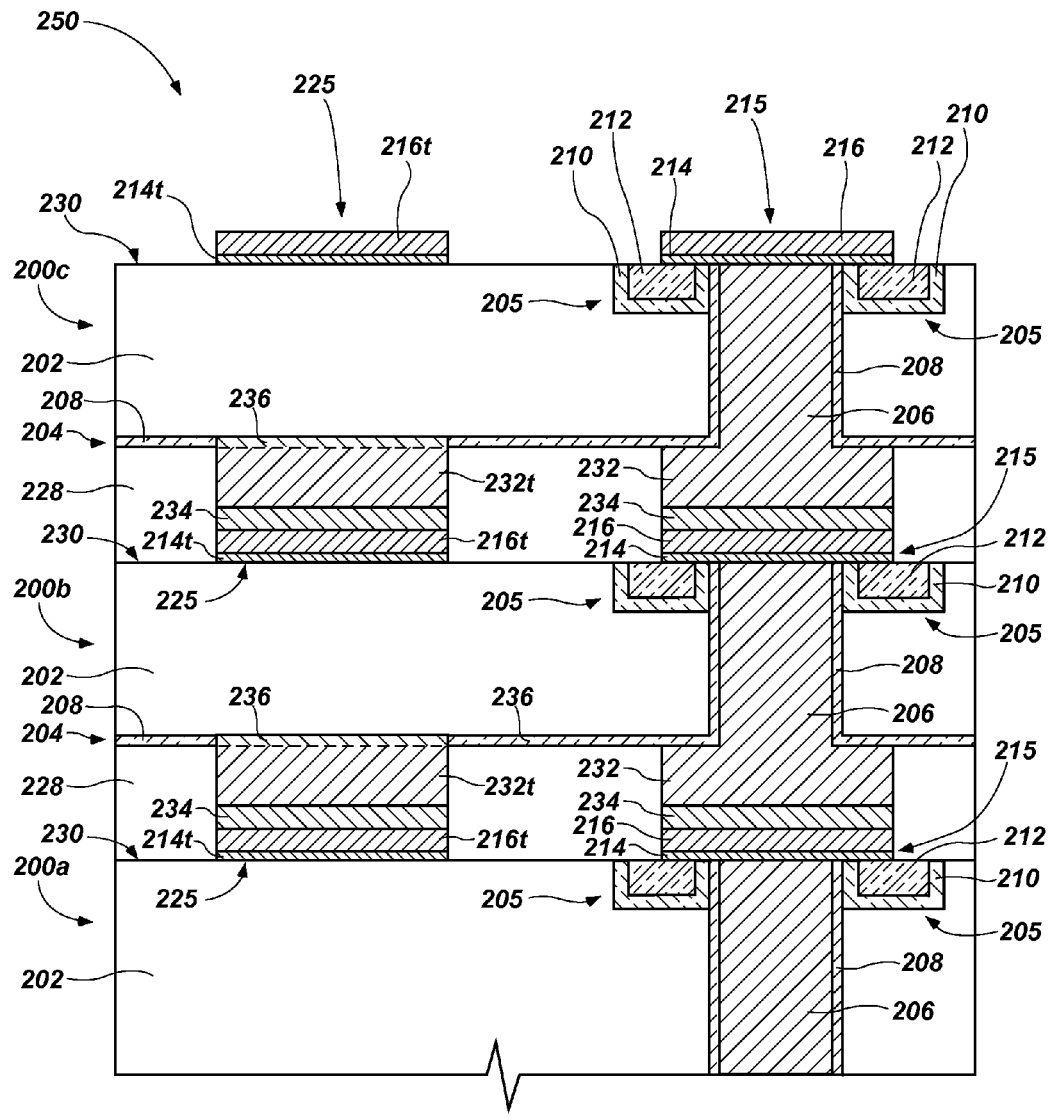
FIG. 4A and FIG. 4B are simplified cross-sectional views of a stack of semiconductor dice according to embodiments of the disclosure.

Referring to FIG. 4A, a die assembly may include a stack 250 of semiconductor structures 200a, 200b, 200c, etc., in the form of, for example, singulated semiconductor dice. The semiconductor structures 200a, 200b, 200c may be similar to semiconductor structure 200 described above with reference to FIG. 2 and may be in the form of semiconductor dice. The stack 250 may be formed by bonding an active surface 204 of one semiconductor structure 200a, 200b, 200c to a back side 230 of an adjacent semiconductor structure 200a, 200b, 200c. Electrically conductive elements 215 may interconnect TSVs 206 and integrated circuits of the semiconductor structures 200a, 200b, 200c. For example, electrically conductive elements 215 of one semiconductor structure 200a, 200b, 200c may be electrically connected through a reflowed solder material 234 on conductive pillars 232 of an adjacent semiconductor structure 200a, 200b, 200c. The conductive pillars 232 may be formed of a suitable conductive material, such as copper, nickel, titanium, tantalum, tungsten, molybdenum, titanium nitride, titanium tungsten (TiW), tantalum nitride, and combinations thereof. In some embodiments, the conductive pillars 232 are formed of the same material as the TSV 206 and comprise an integral structure with TSV 206. The solder material 234 may be formed over the conductive pillars 232 and reflowed in a thermocompression bonding process to physically and electrically connect to electrically conductive elements 215. The solder material 234 may include an Sn/Ag or an Sn/Pb solder material. In some embodiments, a barrier material including nickel (not shown) may be disposed between the material of conductive pillars 232 and the solder material 234. However, the present disclosure is not limited to such examples of electrically connecting an active surface 204 of one semiconductor structure 200a, 200b, 200c to a back side 230 of an adjacent semiconductor structure 200a, 200b, 200c. Rather, the active surface 204 of one semiconductor structure 200a, 200b, 200c may be electrically connected to the back side 230 of an adjacent structure 200a, 200b, 200c by any sufficiently conductive material or a combination thereof and have any suitable structural form to electrically connect adjacent semiconductor structures 200a, 200b, 200c.

As described previously, a dielectric material 208 may surround at least a portion of each of the TSVs 206 and isolation structures 205 may be disposed within a substrate 202 of each semiconductor structure 200a, 200b, 200c in the stack 250. The isolation structures 205 may contact at least a portion of the dielectric material 208 surrounding each of the TSVs 206.

The stack 250 may include thermally conductive elements 225 between adjacent semiconductor structures 200a, 200b, 200c. The thermally conductive elements 225 may contact a substrate 202 of each of adjacent semiconductor structures 200a, 200b, 200c, but may not electrically connect to integrated circuitry of the semiconductor structures 200a, 200b, 200c and may act only as heat transfer conduits between respective semiconductor structures 200a, 200b, 200c of stack 250. A solder material 234, reflowed during a thermocompression bonding process used to electrically connect semiconductor structures 200a, 200b, 200c may connect thermally conductive elements 225 to thermally conductive pillars 232t protruding from an adjacent semiconductor structure 200. The thermally conductive element 225 may include the same or similar materials as electrically conductive elements 215. The thermally conductive elements 225 of semiconductor structure 200c may be in thermal communication with a heat spreader, a heat dissipation structure, or other device suitable for dissipating heat from the stack 250.

In some embodiments, an optional thermal transfer material 236 (shown in broken lines) may be located between the thermally conductive pillars 232t and the substrate 202 on which they are located. The thermal transfer material 236 may include a material that is electrically insulative and thermally conductive. In some embodiments, the thermal transfer material 236 is a thermal interface material (TIM) and may comprise an adhesive, an elastomer, a thermal pad, or a phase change TIM. In other embodiments, the thermal transfer material 236 includes a dielectric material with a high thermal conductivity, such as a polymer or prepolymer material exhibiting a low dielectric constant and a relatively high thermal conductivity.

A dielectric underfill material 228 may be employed to fill regions between adjacent semiconductor structures 200a, 200b, 200c of the stack 250. The underfill material 228 may fill regions between and surrounding electrical and thermal connections between adjacent semiconductor structures 200a, 200b, 200c of the stack 250. The dielectric underfill material 228 may have a relatively high thermal conductivity (e.g., high k) so as to not impede heat transfer between adjacent structures. The dielectric underfill material 228 may include one or more of a polymer material, a prepolymer material, a polyimide material, a silicone material (e.g., an organopolysiloxane material), an epoxy material, a resin material (e.g., a thermal plastic resin material), a curing agent (i.e., a hardener), a catalyst (i.e., an accelerator), a filler material (e.g., silica, alumina, boron nitride, etc.), a fluxing agent, a coupling agent, and a surfactant. The dielectric underfill material 228 may comprise a capillary underfill, a pre-applied non-conductive paste, a non-conductive film, a wafer-level underfill (WLUF), or a molded underfill.

Figure 4B:
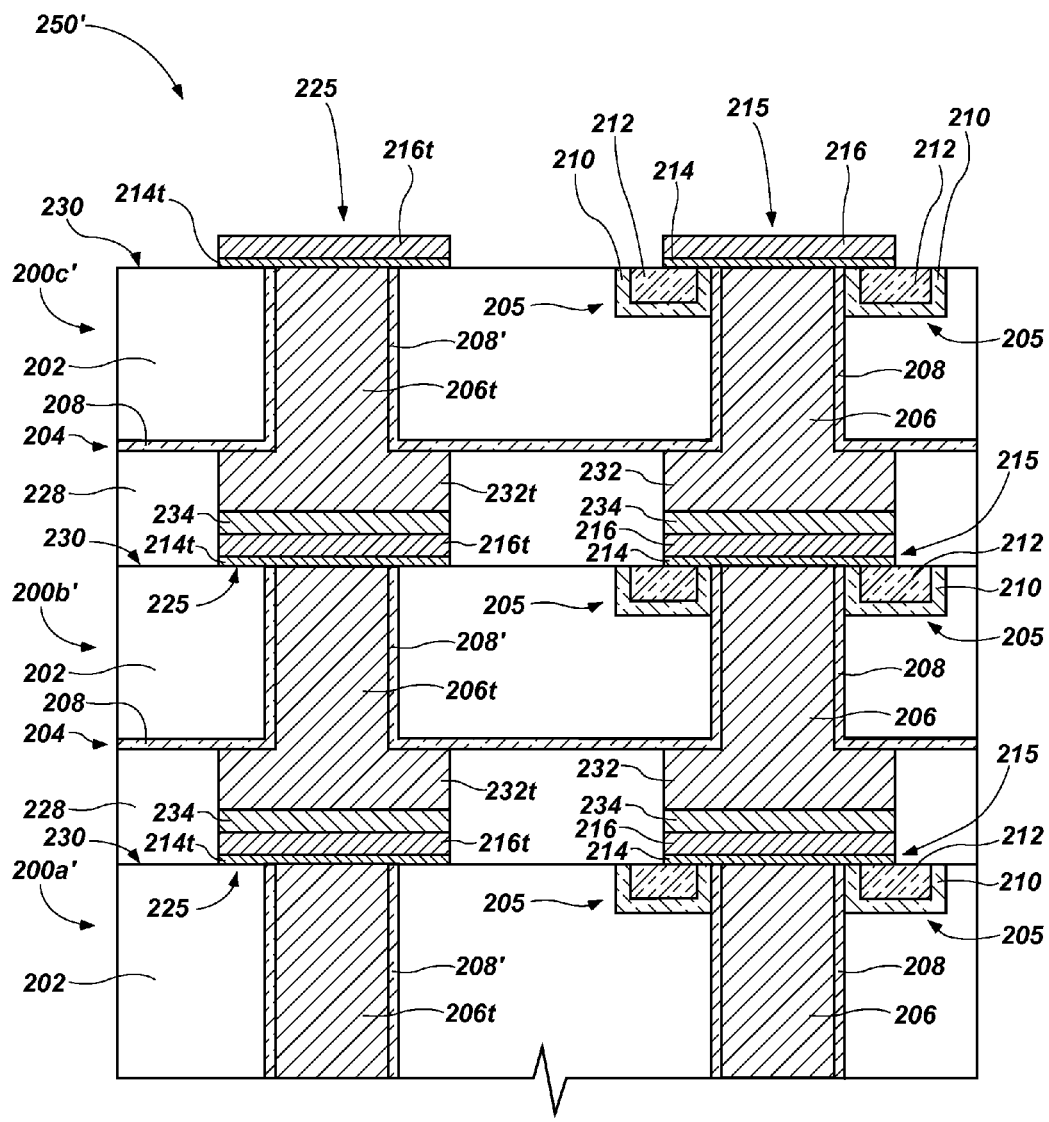

Referring to FIG. 4B, another embodiment of a die assembly including a stack 250' of semiconductor structures 200a', 200b', 200c' is shown. The semiconductor structures 200a', 200b', 200c' may be similar to semiconductor structure 200a, 200b, 200c described above with reference to FIG. 4A. As with stack 250, stack 250' includes thermally conductive elements 225 connected to thermally conductive pillars 232t by a solder material 234 extending between adjacent semiconductor structures 200a', 200b', 200c'. However, unlike the semiconductor structures 200a, 200b, 200c of stack 250, thermally conductive elements 225 may be in contact with thermal TSVs 206t which extend through the substrate 202 of each of the semiconductor structures 200a', 200b', 200c'. Consequently, a continuous heat transfer path is provided through thermally conductive elements 225, thermal TSVs 206t, thermally conductive pillars 232t, and solder material 234. An isolation material 208' may be formed around the thermal TSVs 206+ of the thermally conductive elements 225 to electrically isolate the heat transfer path from substrates 202 and integrated circuitry on active surfaces 204. The isolation material 208' may include a dielectric material similar to dielectric material 208, as well as a barrier material, similar to barrier material 210.

The thermally conductive elements 225 of semiconductor structure 200c' may be in thermal communication with a heat spreader, a heat dissipation structure, or other device suitable for dissipating heat from the stack 250'.

A semiconductor die assembly comprises a stack of semiconductor dice, conductive structures in contact with conductive vias extending through substrates of the semiconductor dice in the stack, the conductive structures extending between semiconductor dice in the stack, dielectric material surrounding at least a portion of each of the conductive vias, isolation structures within the substrates of semiconductor dice in the stack, the isolation structures surrounding one or more of the conductive vias adjacent a substrate surface and in contact with a portion of the dielectric material surrounding each of the conductive vias, conductive elements over the substrate surface in contact with the conductive vias and the conductive structures and extending at least partially over the isolation structures, and at least one thermally conductive structure extending from a semiconductor die in the stack in contact with a thermally conductive element on a same substrate surface of an adjacent semiconductor die in the stack as the conductive elements of the adjacent semiconductor die.

A method of forming a semiconductor die assembly comprises forming recessed isolation structures each surrounding one or more conductive vias in a back side of each of a plurality of semiconductor dice, forming conductive elements in contact with the conductive vias and over the recessed isolation structures, forming thermally conductive elements over the back sides of at least some of the semiconductor dice of the plurality of semiconductor dice, and stacking the plurality of semiconductor dice such that a conductive element of one semiconductor die of the plurality of semiconductor dice contacts a conductive structure protruding from an adjacent semiconductor die of the plurality of semiconductor dice.

Accordingly, semiconductor structures and die assemblies are disclosed. Thermal flow through semiconductor structures may be increased and wafer warpage of semiconductor structures may be decreased by limiting dielectric and insulative materials around conductive structures of the semiconductor structures. For example, by limiting dielectric and insulative materials to a finite area surrounding conductive materials such as conductive vias, bond pads, bond plates, lands, etc., oxide-induced stresses that cause wafer warpage and thermally insulative materials that reduce heat transfer through semiconductor structures may be reduced. Thus, semiconductor structures and die assemblies without a continuous dielectric material across surfaces thereof (e.g., back surfaces) may have increased thermal transfer and reduced oxide-induced stresses.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. A semiconductor structure, comprising:
   a conductive via extending from an active surface of a substrate to a back side of the substrate;
   a dielectric material on a sidewall of the conductive via;
   an isolation structure comprising an insulating material in a recess in the back side of the substrate and surrounding a portion of the conductive via; and
   a conductive material over and in contact with the conductive via and directly over and in contact with at least a portion of the insulating material of the isolation structure, the conductive material in electrical isolation from the substrate, the conductive material extending from over the conductive via to directly over at least a portion of the isolation structure.

2. The semiconductor structure of claim 1, wherein the conductive material comprises a pad.

3. The semiconductor structure of claim 1, wherein the isolation structure further comprises a barrier material on a side of the dielectric material, a portion of the barrier material located between the dielectric material and the insulating material and another portion of the barrier material located between the substrate and the insulating material.

4. The semiconductor structure of claim 1, wherein the isolation structure extends laterally further from the conductive via than the conductive material, the insulating material in contact with a lower portion of the conductive material.

5. The semiconductor structure of claim 1, further comprising a thermally conductive material in contact with the back side of the substrate and electrically isolated from the conductive material.

6. The semiconductor structure of claim 5, wherein the thermally conductive material and the conductive material comprise the same material.

7. The semiconductor structure of claim 1, wherein at least a portion of the dielectric material is between the conductive via and the insulating material.

8. The semiconductor structure of claim 1, wherein the conductive material comprises an undersurface that is substantially coplanar with a surface of the back side of the substrate.

9. The semiconductor structure of claim 1, wherein the conductive material directly overlies and contacts the insulating material and the dielectric material.

10. A semiconductor structure, comprising:
    a substrate having active circuitry on a front side thereof;
    at least one conductive structure on a back side of the substrate and electrically connected to the active circuitry;
    an insulating material in a recess in the back side of the substrate and in contact with the at least one conductive structure;
    a barrier material on sidewalls and a lower portion of the recess, the insulating material over the barrier material in the recess; and
    a thermally conductive element in contact with the back side of the substrate and electrically isolated from the at least one conductive structure.

11. The semiconductor structure of claim 10, wherein the at least one conductive structure and the thermally conductive element comprise the same material.

12. The semiconductor structure of claim 10, wherein the at least one conductive structure is electrically connected to the active circuitry with a conductive via integral with a conductive pillar protruding from the front side of the substrate.

13. The semiconductor structure of claim 12, wherein the conductive via and the conductive pillar comprise copper, the conductive pillar is capped with nickel, and a solder material is located on the nickel.

14. The semiconductor structure of claim 13, further comprising a dielectric material surrounding the conductive via and extending between the conductive via and the insulating material.

15. The semiconductor structure of claim 10, wherein the at least one conductive structure comprises a plurality of conductive structures and the insulating material recessed within the back side of the substrate and in contact with the at least one conductive structure contacts the plurality of conductive structures on the back side of the substrate.

16. A semiconductor die assembly, comprising:
    a stack of semiconductor dice;
    conductive structures in contact with conductive vias extending through substrates of the semiconductor dice in the stack, the conductive structures extending between semiconductor dice in the stack;

dielectric material surrounding at least a portion of each of the conductive vias;

isolation structures comprising a barrier material and an insulation material within the substrates of semiconductor dice in the stack, the isolation structures surrounding one or more of the conductive vias adjacent a substrate surface and in contact with a portion of the dielectric material surrounding each of the conductive vias, the barrier material in contact with the insulation material and the substrate;

conductive elements over the substrate surface in contact with the conductive vias and the conductive structures and directly over at least a Portion of the isolation structures; and at least one thermally conductive structure extending from a semiconductor die in the stack in contact with a thermally conductive element on a same substrate surface of an adjacent semiconductor die in the stack as the conductive elements of the adjacent semiconductor die.

17. The semiconductor die assembly of claim 16, wherein the at least one thermally conductive structure comprises a metal and a thermal interface material in contact with a substrate of the semiconductor die, the thermal interface material comprising an adhesive, an elastomer, a thermal pad, or a phase change thermal interface material.

18. The semiconductor die assembly of claim 16, wherein the at least one thermally conductive structure extends through a substrate of the semiconductor die and is electrically isolated from the conductive structures.

19. The semiconductor die assembly of claim 16, wherein the conductive structures comprise conductive pillars integral with the conductive vias and a solder material.

20. The semiconductor die assembly of claim 16, wherein a portion of the barrier material is between and in contact with the insulation material and the substrate and another portion of the barrier material is between and in contact with the insulation material and the dielectric material.

21. A method, comprising:
forming at least one conductive via extending from an active surface of a substrate to a back surface of the substrate;
forming a dielectric material on a sidewall of the at least one conductive via;
forming a recess within the back surface of the substrate adjacent the at least one conductive via;
forming an isolation structure comprising an insulating material over the back surface and within the recess and surrounding a portion of the at least one conductive via;
removing the insulating material from the back surface while leaving the insulating material within the recess; and
forming a conductive element in electrical isolation from the substrate and over and in contact with the at least one conductive via and directly over and in contact with at least a portion of the insulating material, forming the conductive element comprising forming the conductive element to extend from over the at least one conductive via to directly over at least a portion of the isolation structure.

22. The method of claim 21, wherein forming a recess within the back surface of the substrate comprises removing semiconductor material of the substrate from around the conductive via.

23. The method of claim 21, wherein forming the recess adjacent the at least one conductive via comprises forming the recess to surround the at least one conductive via.

24. The method of claim 21, wherein:
forming at least one conductive via extending from an active surface of a substrate to a back surface of the substrate comprises forming a plurality of conductive vias extending from the active surface of the substrate to the back surface of the substrate; and
forming a recess within the back surface of the substrate adjacent the at least one conductive via comprises forming the recess adjacent the plurality of conductive vias.

25. The method of claim 21, wherein removing the insulating material from the back surface comprises removing a portion of the dielectric material over an end of the at least one conductive via adjacent the back surface to expose the end of the at least one conductive via.

26. The method of claim 21, wherein forming a conductive element in electrical isolation from the substrate and over and in contact with the at least one conductive via comprises forming a conductive material over the back surface, forming a patterned photoresist over the conductive material, and forming another conductive material through the patterned photoresist and over the conductive material.

27. The method of claim 21, further comprising forming a barrier material over the back surface and within the recess prior to forming the insulating material.

28. The method of claim 21, further comprising forming a thermally conductive element on the back surface, laterally spaced from the conductive element and in contact with the substrate.

29. A method, comprising:
forming a stack of semiconductor dice;
forming conductive structures extending between semiconductor dice in the stack and in contact with conductive vias extending through substrates of the semiconductor dice in the stack;
forming a dielectric material surrounding at least a portion of each of the conductive vias;
forming isolation structures comprising a barrier material and an insulation material surrounding one or more of the conductive vias adjacent a substrate surface and in contact with a portion of the dielectric material surrounding each of the conductive vias within substrates of semiconductor dice in the stack, and wherein forming the barrier material comprises forming the barrier material in contact with the insulation material and the substrate;
forming conductive elements in contact with the conductive vias and over the substrate surface and directly over at least a portion of the recessed isolation structures; and
forming at least one thermally conductive structure extending from a semiconductor die in the stack in contact with a thermally conductive element on a same substrate surface of an adjacent semiconductor die in the stack as the conductive elements of the adjacent semiconductor dice.

30. The method of claim 29, wherein forming isolation structures comprising a barrier material and an insulation material comprises forming a barrier material within recesses in back sides of the semiconductor dice and filling the recesses with an insulating material.

* * * * *

UNITED STATES PATENT AND TRADEMARK OFFICE
CERTIFICATE OF CORRECTION

PATENT NO. : 9,653,381 B2  
APPLICATION NO. : 14/307148  
DATED : May 16, 2017  
INVENTOR(S) : Ross S. Dando Page 1 of 1

It is certified that error appears in the above-identified patent and that said Letters Patent is hereby corrected as shown below:

In the Specification

| | | |
|---|---|---|
| Column 5, | Line 25, | change "one then sally conductive" to --one thermally conductive-- |
| Column 8, | Line 50, | change "is fanned over" to --is formed over-- |

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*